United States Patent [19]

Cardinal

[11] 4,309,717
[45] Jan. 5, 1982

[54] COAXIALLY MOUNTED HIGH FREQUENCY LIGHT DETECTOR HOUSING

[75] Inventor: René E. Cardinal, Montreal, Canada

[73] Assignee: RCA Corporation, New York, N.Y.

[21] Appl. No.: 58,021

[22] Filed: Jul. 16, 1979

[51] Int. Cl.³ .................. H01L 23/02; H01L 23/12; H01L 23/16
[52] U.S. Cl. .................... 357/74; 357/30; 357/81; 357/75; 333/246
[58] Field of Search ............ 357/74, 80, 81, 30, 357/75; 333/246

[56] References Cited

U.S. PATENT DOCUMENTS

| 3,001,110 | 9/1961 | Frazier | 357/74 |
| 3,278,763 | 10/1966 | Grove | 333/246 |
| 3,553,499 | 1/1971 | Maguire | 357/74 |
| 3,698,082 | 10/1972 | Hyltin et al. | 357/74 |
| 3,705,255 | 12/1972 | Low et al. | 357/74 |
| 3,710,202 | 1/1973 | Leidich et al. | 357/74 |
| 3,728,589 | 4/1973 | Cauiton | 357/74 |
| 3,745,487 | 7/1973 | Milard et al. | 357/80 |
| 3,946,416 | 3/1976 | Hacskaylo | 357/74 |
| 3,969,752 | 7/1976 | Martin et al. | 357/80 |
| 4,144,504 | 3/1979 | Leggett et al. | 357/81 |
| 4,150,393 | 4/1979 | Wilson et al. | 357/74 |
| 4,168,507 | 9/1979 | Yester | 357/80 |
| 4,200,880 | 4/1980 | Frey | 357/80 |
| 4,232,277 | 11/1980 | Dickens et al. | 357/81 |

*Primary Examiner*—Andrew J. James
*Attorney, Agent, or Firm*—Birgit E. Morris; William J. Burke

[57] ABSTRACT

A light detector housing in which the light detector is mounted directly on the central conductor of a coaxial transmission line and in which an electrically conducting sheet extends around the light detector forming an rf ground plane in close proximity to the detector. One or a plurality of capacitors provide a low impedance electrical connection at rf frequencies and a high impedance at zero frequency between the header of the housing and the electrically conducting sheet.

9 Claims, 2 Drawing Figures

COAXIALLY MOUNTED HIGH FREQUENCY LIGHT DETECTOR HOUSING

The invention is a light detector housing with minimum stray reactances which can be matched to a transmission line permitting operation of the light detector in the frequency range greater than 1 gigahertz.

BACKGROUND OF THE INVENTION

The frequency response or bandwidth of an electrical device is defined as that frequency where the output power amplitude is reduced by 3 dB, a factor of two, from its true value. For a p-i-n or avalanche photodiode the device frequency response is increased by narrowing the active region of the device, thus minimizing carrier transit time delays, and by reducing the cross-sectional area of the device, thus reducing the device capacitance. For avalanche and p-i-n photodiode light detectors the frequency response extends from dc to greater than several gigahertz, hereinafter GHz, but is typically limited by stray reactances in the light detector housing and by impedance mismatch to the external electrical circuitry.

Webb et al, U.S. Pat. No. 4,233,619 issued Nov. 11, 1980 and entitled LIGHT DETECTOR HOUSING FOR FIBER OPTIC APPLICATIONS and incorporated herein by reference, have disclosed an electro-optic device housing in which an avalanche or p-i-n photodiode can be mounted. The housing comprises a header; electrical signal and bias electrodes inserted through the header; a light detector mounted on one of the electrodes; means for electrically connecting the light detector to the electrodes; a cap, bonded to the header, which encloses the light detector; and a light pipe extending through an opening in the cap towards the light detector. Alternatively, the light pipe of Webb et al can be replaced by a window mounted on the cap. The upper limit to the frequency response of this device is about one GHz and is limited by stray reactances in the housing, and by impedance mismatch to the signal transmission line. It would be desirable to have a housing with reduced stray reactances and which can be matched directly to the signal transmission line in order to make use of the higher frequency response of the light detector.

Low et al, U.S. Pat. No. 3,705,255 issued Dec. 5, 1972, have disclosed a package suitable for housing microwave semiconductor components. The package comprises an electrically conductive stud having one end that is cylindrically shaped and another end that is conically shaped, wherein the conical end is flat so that a semiconductor component can be mounted thereon; a cylindrical flange extending outward from a point between the cylindrical and conical ends of the stud; an insulating ring mounted on the flange about the conical end of the stud; an electrically conductive washer mounted on the other side of the insulating ring; an insulating washer mounted on the other side of the electrically conductive washer and an electrically conducting cap mounted on the other side of the insulating washer. The stud, the electrically conductive washer and the cap form the external terminals of the housing and are connected to the different terminals of the semiconductor component mounted therein. This housing has reduced inductive and capacitive reactances, thus making it suitable for use with semiconductor devices such as transistors which operate in the GHz range. This device does not provide a direct match to an external transmission line or detector to obtain maximum frequency response.

SUMMARY OF THE INVENTION

The invention is an improved light detector housing having increased frequency response obtained by reducing stray reactances in the housing. The stray reactances are reduced by connecting the signal terminal to the light detector to the central conductor of a coaxial transmission line; mounting an electrically conducting sheet, which extends at least partially around the light detector, on the header; and electrically connecting this conducting sheet to the header using one or a plurality of capacitors whereby the electrically conducting sheet forms a radio frequency ground plane in proximity to the light detector.

DETAILED DESCRIPTION OF THE INVENTION

Figure 1:
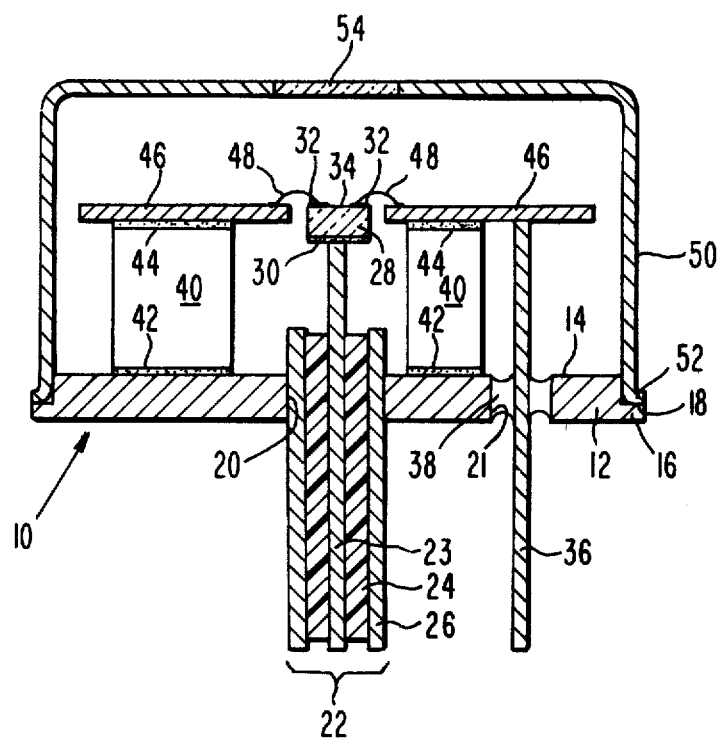
FIG. 1 is a schematic illustration of a side view of the light detector housing of the invention.

In FIG. 1 the light detector housing 10 includes a header 12 having a first surface 14; a flange 16 extending about the periphery of the header 12 and having an upper surface 18; openings 20 and 21 extending through said header; and a coaxial transmission line 22 extending through the opening 20 in the header 12. The coaxial transmission line 22 is comprised of a central conductor 23, a dielectric spacer 24 mounted coaxially about the central conductor 23 and a conducting tube 26 coaxially mounted about the dielectric spacer 24. The outer conductor is electrically connected to the header 12. A light detector 28 is mounted on the central conductor 23 of the coaxial transmission line 22. The light detector 28 has a first electrical terminal 30, a second electrical terminal 32, and a light sensitive surface 34. The first electrical terminal 30 is electrically connected to the central conductor 23. An electrical bias lead 36 passes through the opening 21 in the header 12 and is mounted to and electrically isolated from the header 12 by the electrical isolation seal 38. One or more capacitors 40 each having a first electrical plate 42 and a second electrical plate 44 are mounted on the header 12. The first electrical plate 42 is electrically connected to the surface 14 of the header 12. The second electrical plate 44 is electrically connected to an electrically conducting sheet 46. The electrically conducting sheet 46 extends circumferentially about the light detector 28 for at least a portion of its periphery and is electrically connected to the electric bias lead 36 and the second terminal 32 of the light detector 28 by one or more bias wires 48. Alternatively, the electric bias lead 36 can be electrically connected directly to the second terminal 32 using other means. An electrically conducting cap 50, having a flange 52 and a light transmissive medium 54 mounted therein is mounted on and electrically connected to the header 12 so as to enclose the light detector 28, the capacitor or capacitors 40, and the electrically conducting sheet 46.

The invention is a light detector housing which permits the operation of the light detector in the frequency range greater than 1 GHz, the typical upper limit for prior art housings. The increased frequency response is obtained by mounting the light detector directly on a coaxial transmission line whose impedance is matched to that of an external transmission line and that of the electrical signal receiver amplifier, and by mounting an electrically conducting sheet, in close proximity to the light detector, to serve as an rf ground plane thus minimizing stray reactances within the housing.

The header 12 is an electrically conducting plate, typically circular with openings 20 and 21 therethrough for the electrical signal and bias leads. The header 12 is typically comprised of stainless steel which may be plated with a high conductivity material such as gold.

The flange 16 of the header 12 is used for resistance welding the cap 50 to the header 12. The flange 16 is not required if alternate means are used for fastening the cap 50 to the header 12.

The coaxial transmission line 22 which extends through the opening 20 in the header 12 is comprised of a central conductor 23, a dielectric spacer 24 and the outer tube 26. The central conductor 23 is typically a metal. The dielectric spacer 24 is typically teflon but other low loss dielectric materials may be used. To hermetically seal the transmission line the dielectric spacer 24 may be broken along its length and replaced by an insulating seal, typically metal-to-glass-to-metal, between the central conductor 23 and the other tube 26. The outer tube 26 may be fastened and electrically connected to the header by soldering, welding or other suitable techniques. The dielectric spacer 24 and the outer tube 26 can extend through the header 12 to within a close proximity of the light detector 28. The dimensions of the dielectric spacer 24 and the outer tube 26 are chosen to provide the desired impedance match to the external transmission line. Alternatively, the coaxial transmission line 22 can be formed from a commercially available coaxial connector which may be either screwed into or soldered or welded to the header.

The electric bias lead 36 is fastened to and electrically isolated from the header 12 using the electrical isolation seal 38. The electrical isolation seal 38 is typically a curable epoxy resin or a metal-to-glass-to-metal seal which provides both the fastening and the isolation.

The light detector 28 may be an avalanche or p-i-n photodiode. For high frequency applications such photodiodes typically have a small cross-sectional area to minimize device capacitance and a thin depletion region to minimize carrier transit time delays. The photodiode is typically mounted with the p-n junction plane parallel to the plane of the header and closest to the central conductor 23. This mounting arrangement minimizes capacitive loading of the transmission line by the photodiode.

Capacitor or capacitors 40 provide a low impedance, typically less than 100 ohms, electrical connection between the header 12 and the electrically conducting sheet 46 at radio frequencies and a high impedance at dc. Thus, they convert the electrically conducting sheet 46 into an rf ground plane while maintaining electrical isolation of the dc bias voltage from the header 12. Typical values for these capacitors are about 5 to 500 picofarads.

At frequencies where the dimensions of the capacitors become comparable to the electrical signal wavelength in the capacitors the electrically conducting sheet 46 and the capacitors become, in effect, a distributed ring resonator.

The sheet 46 extends circumferentially around the light detector 28 preferably in the same plane as the p-n junction although it is not necessary that it extend completely around the light detector 28. Typically, the sheet 46 is a disk of a metal such as copper or stainless steel and has a hole in its center in which the light detector 28 is located.

The electrically conducting sheet 46 is electrically connected to the bias lead 36 and forms an electrical connection from the bias lead 36 to within close proximity of the light detector 28. One or more bias wires 48 provide electrical connection between the sheet 46 and the second terminal 32 of the photodiode of the light detector 28 to supply the dc bias voltage to the light detector 28. The bias wires 48 are preferably uniformly spaced, short and numerous to minimize series inductance. I have used up to eight such wires.

The electrically conducting sheet 46 may be mechanically supported by the bias lead 36, the capacitor or capacitors 40, or by alternative support means such as ceramic spacers or by a combination of several or all of these. Preferably, the sheet 46 is supported by the bias lead 36 and the plurality of capacitors 40, typically three, which are distributed circumferentially about the light detector 28.

Figure 2:
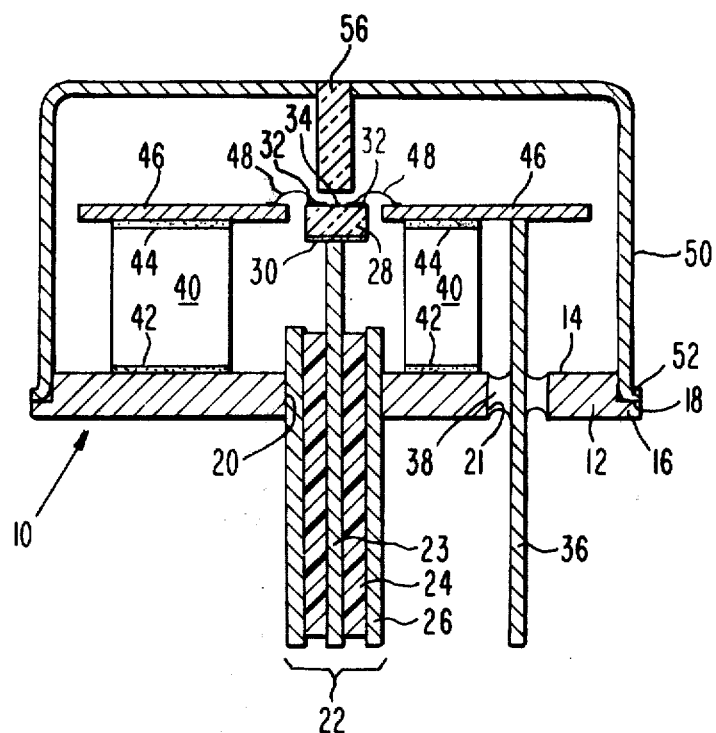
FIG. 2 is a schematic illustration of a cross-sectional view of a second embodiment of the invention.

The light sensitive medium 54 can be either a window mounted in the cap or a fiber optic light pipe 56 mounted in the cap and extending down to within a close proximity of the light sensitive surface 34 of the light detector 28 as shown in FIG. 2, where the identification of the remaining elements is the same as that of FIG. 1. The window or fiber optic light pipe may be either welded or glued with a cureable epoxy resin to the cap 50.

A light detector housing was constructed according to the description above. An RCA avalanche photodiode type number C30931, manufactured by RCA Limited, Montreal, Canada, was soldered to the central conductor of the SMA 50 ohm connector manufactured by the Amphenol-Borg Corporation, Broadview, Ill. Three capacitors, type ATC 100 manufactured by American Technical Corporation, Huntington Station, N.Y., having a value of 100 picofarads were used to provide the low impedance rf connection between the electrically conducting sheet and the header.

The avalanche photodiode mounted in this housing was illuminated with the output light from an AlGaAs double heterojunction laser. The output light consisted of 35 nanosecond long pulses superimposed on which was a self-induced internal oscillation. The photodiode was reversed biased to about 140 volts and the output was measured and displayed using an oscilloscope. A response time of 100 to 200 picoseconds was estimated from the self-induced oscillations. This corresponds to a minimum upper frequency of about 2 to 4 GHz.

I claim:

1. In a light detector housing which comprises:
a header having two openings therethrough; an electrical bias lead and an electrical signal lead, each extending through said header, wherein said bias lead and said signal lead are fastened to and electrically isolated from said header; a light detector having two terminals and a light sensitive surface mounted on said signal lead and having a first terminal electrically connected to said signal lead; means for electrically connecting a second terminal of said light detector to said bias lead; an electrically conducting cap fastened to and electrically connected to the header so as to enclose said bias lead, said electrical signal lead and said light detector; a light transmissive medium mounted in said cap, whereby light impinging on said light transmissive medium enters the housing and impinges on the light sensitive surface of said light detector mounted on and;

the improvement which comprises:

an electrical signal lead which comprises a coaxial transmission line, having a central conductor, wherein a first terminal of said light detector is electrically connected to the central conductor; and an electrically conducting sheet, electrically connected to said bias lead and extending at least partially around said light detector;

means for supporting said electrically conducting sheet;

one or a plurality of capacitors each having a first plate electrically connected to the header and a second plate electrically connected to said electrically conducting sheet wherein said capacitors are of an effective capacitance to provide a low impedance electrical connection between the electrically conducting sheet and the header at radio frequencies and a high impedance at zero frequency.

2. A light detector housing according to claim 1 wherein said coaxial transmission line comprises a central conductor, a dielectric spacer coaxially mounted about said central conductor, and an outer conductor coaxially mounted about said dielectric spacer.

3. A light detector housing according to claim 2 wherein the dimensions of said dielectric spacer and said outer tube are so chosen as to provide an impedance match to an external electrical signal transmission line and detector.

4. A light detector housing according to claim 2 wherein said dielectric spacer and said outer conductor extend to within a close proximity of the light detector.

5. A light detector housing according to claim 1 wherein the means for supporting the electrically conducting sheet are said capacitor or plurality of capacitors and the electrical bias lead.

6. A light detector housing according to claim 1 wherein the electrically conducting sheet extends circumferentially around the light detector and lies in about the same plane as the plane of the p-n junction of the light detector.

7. A light detector housing according to claim 1 wherein said light transmissive medium is a window.

8. A light detector housing according to claim 1 wherein said light transmissive medium is a fiber optic light pipe.

9. The light detector housing according to claim 1 wherein the capacitance of each capacitor is between about 5 and about 500 picofarads.

* * * * *